(12) United States Patent
Seo et al.

(10) Patent No.: US 8,448,043 B2
(45) Date of Patent: May 21, 2013

(54) OVERWRITABLE NONVOLATILE MEMORY DEVICE AND RELATED DATA WRITE METHOD

(75) Inventors: Hui Kwon Seo, Hwaseong-si (KR); Sei Jin Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 317 days.

(21) Appl. No.: 13/005,184

(22) Filed: Jan. 12, 2011

(65) Prior Publication Data
US 2011/0185259 A1    Jul. 28, 2011

(30) Foreign Application Priority Data

Jan. 25, 2010  (KR) .................. 10-2010-0006476

(51) Int. Cl.
*G11C 29/00*    (2006.01)
(52) U.S. Cl.
USPC ........................................................ 714/763
(58) Field of Classification Search
USPC ..... 714/746, 753, 763–764, 769; 365/189.05, 365/14, 201
See application file for complete search history.

(56) References Cited

U.S. PATENT DOCUMENTS

| 6,321,360 | B1 | 11/2001 | Takeuchi et al. |
| 7,392,456 | B2* | 6/2008 | Leung et al. .................. 714/763 |
| 7,610,542 | B2 | 10/2009 | Nagai |
| 7,861,138 | B2* | 12/2010 | Oh .............................. 714/763 |
| 8,010,872 | B2* | 8/2011 | Hashimoto et al. ........... 714/763 |
| 8,289,786 | B2* | 10/2012 | Huang et al. ............. 365/189.14 |

FOREIGN PATENT DOCUMENTS

| JP | 2004199713 A | 7/2004 |
| JP | 2007242162 A | 9/2007 |
| JP | 2008269671 A | 11/2008 |
| KR | 100305994 B1 | 8/2001 |

\* cited by examiner

*Primary Examiner* — Shelly A Chase
(74) *Attorney, Agent, or Firm* — Volentine & Whitt, PLLC

(57) ABSTRACT

A nonvolatile memory device comprises overwritable memory cells. In an overwrite operation, data is read from a selected region of the nonvolatile memory device and combined with overwrite data to produce combined data. An error correction code is then generated for the combined data and the overwrite data and the error correction code are stored in the selected region.

20 Claims, 13 Drawing Sheets

OVERWRITABLE NONVOLATILE MEMORY DEVICE AND RELATED DATA WRITE METHOD

CROSS-REFERENCE TO RELATED APPLICATIONS

This application claims priority under 35 U.S.C. §119 to Korean Patent Application No. 10-2010-0006476 filed on Jan. 25, 2010, the disclosure of which is hereby incorporated by reference in its entirety.

BACKGROUND

Embodiments of the inventive concept relate generally to semiconductor memory devices. More particularly, embodiments of the inventive concept relate to overwritable nonvolatile memory devices and related data write methods.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

Examples of volatile memory devices include dynamic random access memory (DRAM) and static random access memory (SRAM). Examples of the nonvolatile memory devices include masked read-only memory (MROM), programmable read-only memory (PROM), erasable programmable read-only memory (EPROM), and electrically erasable programmable read-only memory (EEPROM).

The demand for nonvolatile memory devices has continually increased over the past several decades. Moreover, in recent years, there has been an increasing demand for nonvolatile memory devices that can be used as execute in place (XIP) devices. Accordingly, research is being conducted to develop and improve overwritable nonvolatile memory (NVM) devices.

Examples of overwritable nonvolatile memory devices include ferroelectric RAM (FRAM) using ferroelectric capacitors, magnetic RAM (MRAM) using a tunneling magnetoresistive (TMR) layer, phase-change random access memory (PRAM) using a chalcogenide alloy, and resistive RAM (ReRAM) using a variable-resistance material layer as a data storage medium.

SUMMARY

Embodiments of the inventive concept provide overwritable nonvolatile memory devices and methods of operating the overwritable nonvolatile memory devices. In certain embodiments, various error detection and correction techniques are applied to the overwritable nonvolatile memory devices to improve their reliability.

According to one embodiment of the inventive concept, a method of writing data in a nonvolatile memory device comprises receiving a command, receiving an address corresponding to a selected cell region of the nonvolatile memory device, and receiving input data, decoding the command to determine whether it is a program command or an overwrite command. Upon determining that the command is an overwrite command, the method identifies the input data as overwrite data, reads data from the selected cell region to produce read data, combines the read data with the overwrite data to produce combined data, generates an error correction code for the combined data, performs an overwrite operation to store the overwrite data in the selected cell region, and stores the error correction code for the combined data in the nonvolatile memory device.

In certain embodiments, the method further comprises detecting and correcting an error in the read data.

In certain embodiments, the read data comprises user data and an error correction code for the user data.

In certain embodiments, the combined data is generated by combining the user data with the overwrite data.

In certain embodiments, the method further comprises, upon determining that the command is a program command, identifying the input data as program data, generating an error correction code for the program data, and storing the program data and the error correction code for the program data, in the selected cell region.

In certain embodiments, the read data is produced before the input data is received.

In certain embodiments, the nonvolatile memory device comprises a phase change memory device.

In certain embodiments, the error correction code comprises one or more parity bits or a Hamming code.

According to one embodiment of the inventive concept, a nonvolatile memory device comprises a cell array comprising overwritable memory cells, a read/write circuit that performs read and write operations on the cell array, and control logic that decodes a write command to determine whether the write command is an overwrite command or a program command, and upon determining that the write command is an overwrite command, controls the read/write circuit to read data from a selected region of the cell array to produce read data, combines the read data with overwrite data to generate combined data, generates an error correction code for the combined data, and controls the read/write circuit to store the overwrite data and the error correction code for the combined data in the cell array.

In certain embodiments, the error correction code is a Hamming code.

In certain embodiments, the control logic performs an error detection and correction operation on the read data.

In certain embodiments, the control logic determines whether the read data contains an uncorrectable error, and upon determining that the read data contains an uncorrectable error, controls the read/write circuit to reread the data from the selected region.

In certain embodiments, the cell array comprises phase change memory cells.

In certain embodiments, the control logic comprises a command decoder that decodes the write command, a program controller that is enabled where the write command is a program command, and an overwrite controller that is enabled where the write command is an overwrite command.

In certain embodiments, the control logic comprises an error correction code circuit that generates the error correction code for the combined data, and the read/write circuit comprises a sense amplifier that senses the selected region to produce the read data, a read buffer that temporarily stores the read data, a write buffer that temporarily stores the overwrite data and the error correction code for the combined data, and a write driver that writes the overwrite data stored in the write buffer and the error correction code for the combined data in the selected region.

In certain embodiments, the error correction code circuit detects and corrects an error in the read data.

In certain embodiments, the combined data is generated after the error correction code has detected and corrected the error in the read data.

In certain embodiments, the error correction code for the combined data comprises one or more parity bits.

In certain embodiments, where the write command is a program command, the control logic generates an error correction code for program data to be stored in the cell array.

In certain embodiments, the method further comprises an address decoder that decodes an address to select the selected region of the cell array, and an input/output buffer that receives the overwrite data from an external device under the control of the control logic.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, a PRAM device is presented as an example of an overwritable nonvolatile memory device to illustrate various embodiments of the inventive concept. The inventive concept, however, is not limited to PRAM devices, and can be embodied in many other forms, including other types of nonvolatile memory devices. In addition, many other changes can be made to the described embodiments without departing from the scope of the inventive concept.

Figure 1:
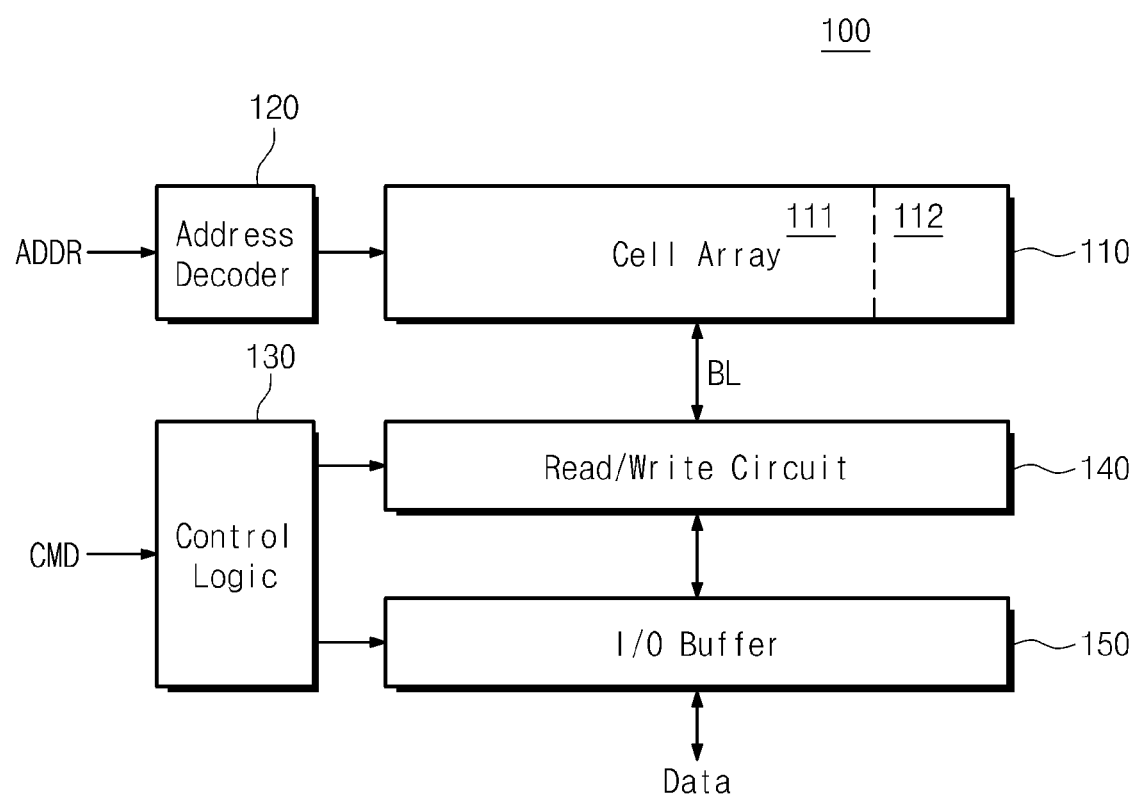
FIG. 1 is a block diagram of a nonvolatile memory device according to an embodiment of the inventive concept.

FIG. 1 is a block diagram of a nonvolatile memory device 100 according to an embodiment of the inventive concept.

Referring to FIG. 1, nonvolatile memory device 100 comprises a cell array 110, an address decoder 120, control logic 130, a read/write circuit 140, and an input/output (I/O) buffer 150.

Cell array 110 comprises a plurality of memory cells arranged in rows connected to corresponding word lines, and columns connected to corresponding bit lines. Each memory cell is a nonvolatile memory element capable of storing one or more bits of data. In addition, the memory cells in cell array 110 are overwritable, meaning that they can be re-written without first performing an erase operation.

Cell array 110 is divided into a main region 111 and a spare region 112. Main region 111 is configured to store user data, and spare region 112 is configured to store an error correction code (ECC) generated from the user data stored in main region 111. The user data and the ECC generated from the user data will be referred to collectively as a write unit. The ECC can comprise, for instance, one or more parity bits, a Hamming code, or other information that can be used to perform error detection and/or correction on the user data.

Address decoder 120 decodes an input address ADDR to select a row and a column of memory cells in cell array 110. For instance, in a data read operation, address decoder 120 selects a row by selecting a word line corresponding to an input row address and selects a column by selecting bit lines corresponding to an input column address.

Control logic 130 controls read/write circuit 140 and I/O buffer 150 according to a command CMD received from an external source. Command CMD can be a read command, an erase command, or a write command. The write command can include an overwrite command or a program command. The program command initiates an operation to write a write unit in erased memory cells. The overwrite command initiates an operation to write at least one bit of data in memory cells that already contain stored data.

Control logic 130 receives and decodes command CMD. According to command CMD, control logic 130 controls read/write circuit 140 to perform a read, erase, program, or overwrite operation on a target region of cell array 110. Where the decoded command CMD corresponds to a read operation, control logic 130 controls read/write circuit 140 to read data stored in the target region. Where the decoded command CMD corresponds to an erase operation, control logic 130 controls read/write circuit 140 to erase data stored in the target region. Where the decoded command CMD corresponds to a program operation, control logic 130 controls read/write circuit 140 to write input data in the target region. Where the decoded command CMD corresponds to an overwrite operation, control logic 130 controls read/write circuit 140 to perform an overwrite operation that includes updating an ECC.

Read/write circuit 140 reads and writes data in cell array 110 under the control of control logic 130. In an overwrite operation, read/write circuit 140 selects the target region of cell array 110 according to address ADDR, and overwrites at least one bit of the target region with received overwrite data. Before overwriting the data in the target region, read/write circuit 140 reads the data from the target region and detects and corrects any errors in the read data using an ECC included in the read data.

Read/write circuit 140 combines the overwrite data with the error-corrected read data and generates a new ECC from the combination of the overwrite data and the error-corrected data. Read/write circuit 140 writes the overwrite data in main region 111 and writes the new ECC in spare region 112.

In a program operation, read/write circuit 140 does not perform a sensing operation on a target region. Accordingly, read/write circuit 140 generates an ECC based solely on write data received from an external device. Also, read/write circuit 140 writes both the generated ECC and the write data in the target region of cell array 110.

In program and overwrite operations of nonvolatile memory device 100, control logic 130 controls I/O buffer 150 to temporarily store data received from an external device. The data stored temporarily in I/O buffer 150 is provided to read/write circuit 140 in order to be written in cell array 110. In read operations, I/O buffer 150 temporarily stores data received from read/write circuit 140 and transfers the stored data to an external device. In certain embodiments, I/O buffer 150 temporarily stores a command or an address received from an external device and transfers the command or address to control logic 130 or address decoder 120.

Figure 2:
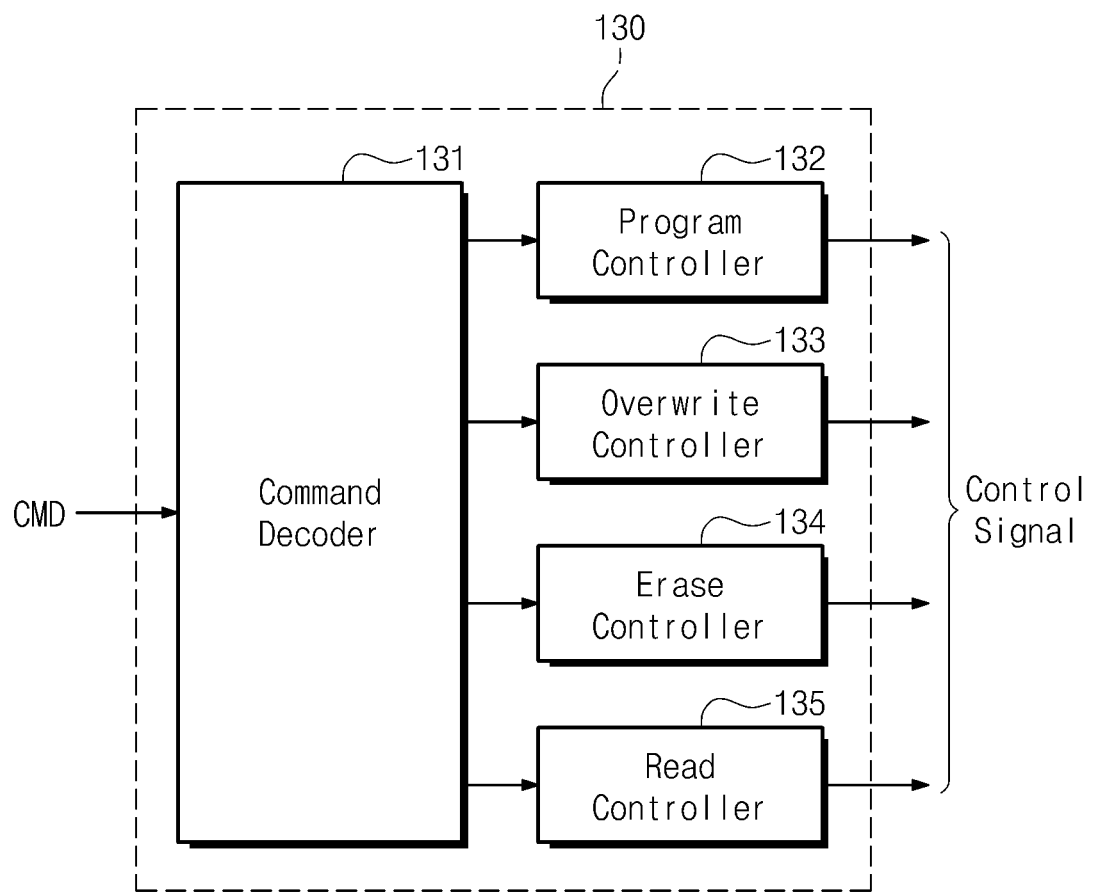
FIG. 2 is a block diagram of a control logic component in the nonvolatile memory device of FIG. 1.

FIG. 2 is a block diagram of control logic 130 of FIG. 1 according to an embodiment of the inventive concept.

Referring to FIG. 2, control logic 130 comprises a command decoder 131, a program controller 132, an overwrite controller 133, an erase controller 134, and a read controller 135.

Command decoder 131 decodes a command CMD received from an external device. According to the decoded command CMD, command decoder 131 enables one of program controller 132, overwrite controller 133, erase controller 134, and read controller 135. Where the decoded command CMD corresponds to a program operation, command decoder 131 enables program controller 132. Where the decoded command CMD corresponds to an overwrite operation, command decoder 131 enables overwrite controller 133. Where the decoded command CMD corresponds to an erase operation, command decoder 131 enables erase controller 134.

Program controller 132 controls read/write circuit 140 to perform program operations. In a program operation, program controller 132 receives program data and controls read/write circuit 140 to generate an ECC from the received program data. Program controller 132 then controls read/write circuit 140 to write the program data and the ECC in erased memory cells of cell array 110.

Overwrite controller 133 controls read/write circuit 140 to perform overwrite operations. In an overwrite operation, overwrite controller 133 controls read/write circuit 140 to read data stored in a target region corresponding to address ADDR, and further controls read/write circuit 140 to detect or correct any errors in the read data. Overwrite controller 133 then controls read/write circuit 140 to generate a new ECC for a combination of the error-corrected read data and received overwrite data. Overwrite controller 133 then controls read/write circuit 140 to write the overwrite data and the new ECC in the target region.

Erase controller 134 controls read/write circuit 140 to erase data in a memory region corresponding to address ADDR. Read controller 135 controls read/write circuit 140 to read data in a target region corresponding to address ADDR.

Figure 3:
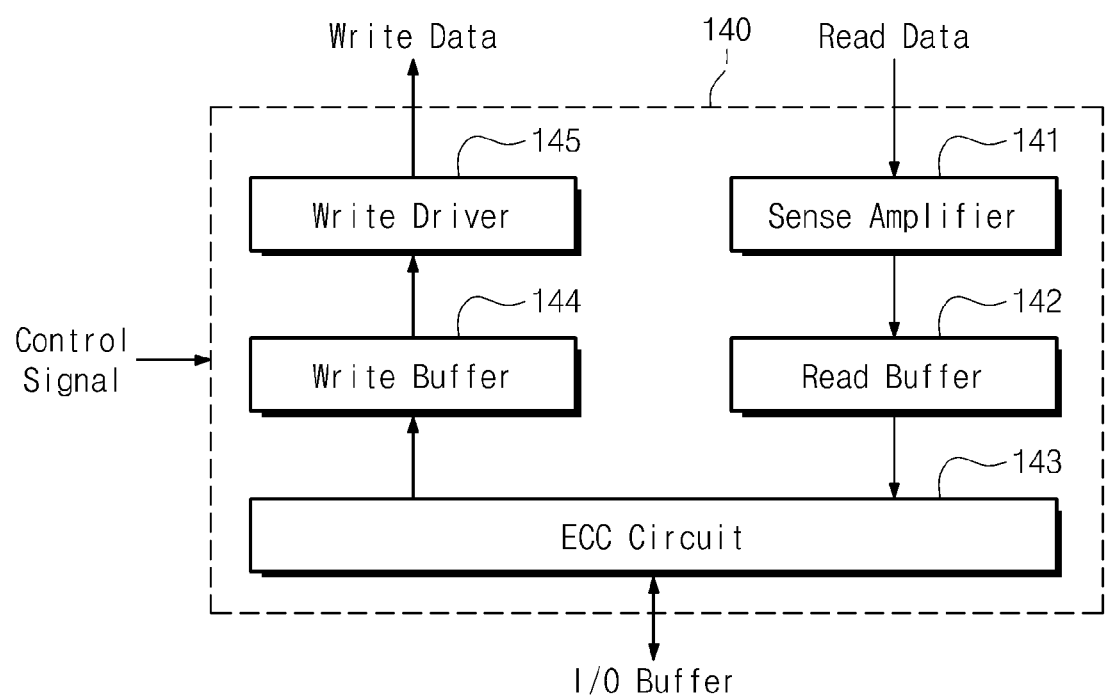
FIG. 3 is a block diagram of a read/write circuit in the nonvolatile memory device of FIG. 1.

FIG. 3 is a block diagram of read/write circuit 140 of FIG. 1 according to an embodiment of the inventive concept.

Referring to FIG. 3, read/write circuit 140 comprises a sense amplifier 141, a read buffer 142, an ECC circuit 143, a write buffer 144, and a write driver 145.

Sense amplifier 141 senses selected memory cells from a target region of cell array 110 to produce read data. In certain embodiments, sense amplifier 141 uses electrical signals corresponding to resistance values of the selected memory cells to produce the read data. Where a memory cell comprises a variable resistor, sense amplifier 141 can determine a logic value '1' or a logic value '0' by sensing a level of a current corresponding to a voltage applied to the memory cell.

Read buffer 142 temporarily stores read data produced by sense amplifier 141. Read buffer 142 and sensor amplifier 141 are typically provided respectively in main region 111 and spare region 112 of cell array 110.

In a program operation, ECC circuit 143 generates an ECC of program data under the control of control logic 130. In an overwrite operation, ECC circuit 143 generates a new ECC of combined program and overwrite data under the control of control logic 130. ECC then provides the overwrite data and the new ECC to write buffer 144 to write the overwrite data and the new ECC in the target region.

Write buffer 144 temporarily stores data to be written in cell array 110 and transfers the stored data to write driver 145. Write driver 145 writes the received data in a selected cell region of cell array 110.

Read/write circuit 140 performs erase, read, overwrite, and program operations in response to control signals from control logic 130.

Figure 4:
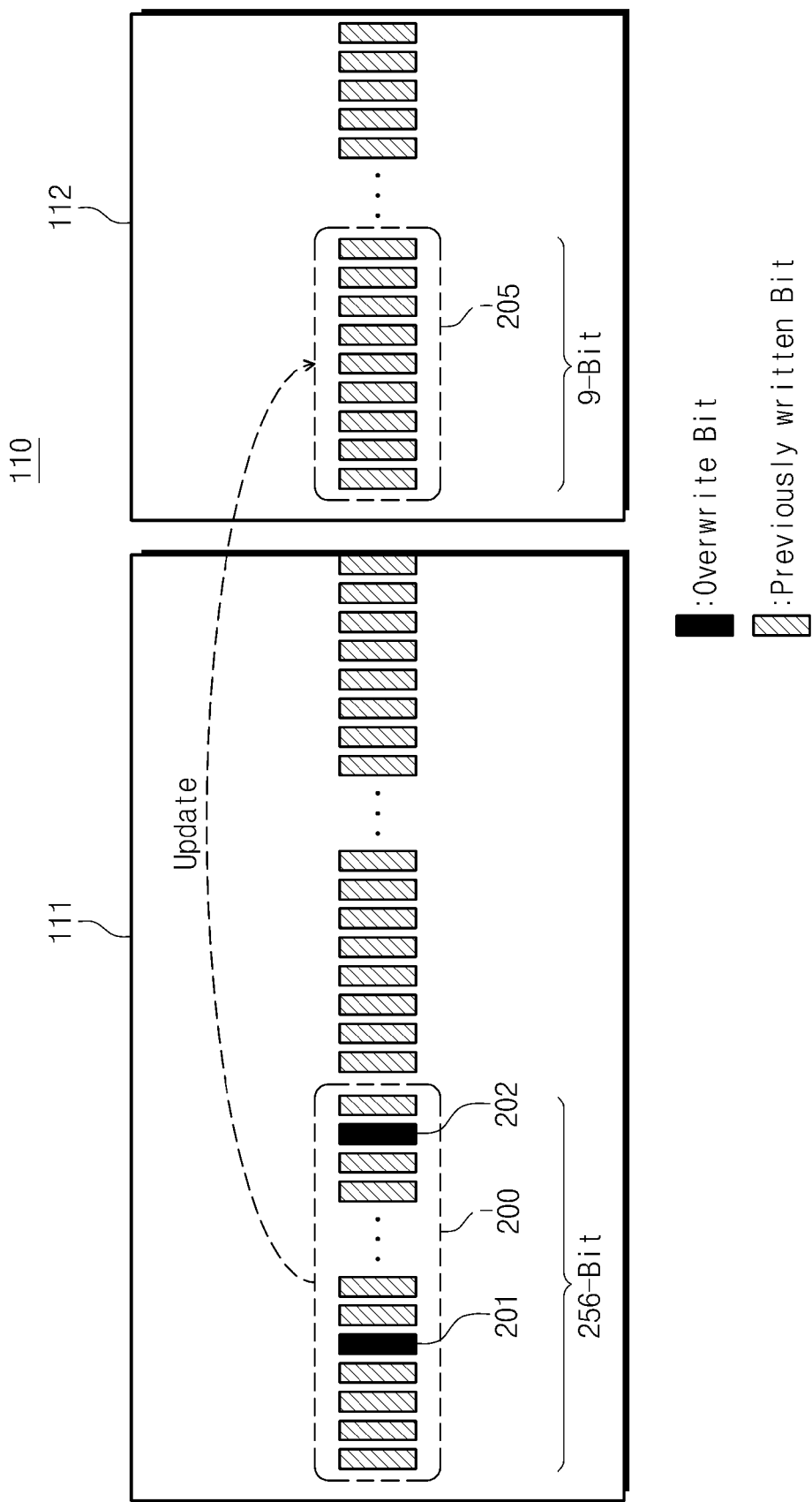
FIG. 4 is a diagram illustrating a method of performing an overwrite operation in a nonvolatile memory device according to an embodiment of the inventive concept.

FIG. 4 is a diagram illustrating a method of performing an overwrite operation in nonvolatile memory device 100 according to an embodiment of the inventive concept.

Referring to FIG. 4, upon receiving overwrite data 201 and 202, nonvolatile memory device 100 creates user data 200 including overwrite data 201 and 202. Nonvolatile memory device 100 generates an ECC 205 from user data 200.

In a program operation, data corresponding to one write unit is written in a target region of cell array 110. For instance, user data (e.g., 256-bit) and an ECC (e.g., 9-bit for a Hamming code) of one write unit is written respectively in main region 111 and spare region 112.

In an overwrite operation, overwrite data 201 and 202 is received from an external device and programmed in a target region of cell array 110, together with ECC 205. ECC 205 is typically updated whenever an overwrite operation is performed.

ECC 205 is generated from user data 200 including overwrite data 201 and 202. Consequently, user data 200 is created before ECC 205. The bits of user data 200 other than overwrite data 201 and 202 are already written in main region 111. Thus, a read operation is performed on main region 111 to create user data 200 for the overwrite operation. In the read operation, an ECC is used to detect any errors in the read data. Overwrite data 201 and 202 are then combined with the error-corrected read data to create user data 200, and ECC 205 is then generated from user data 200 comprising overwrite data 201 and 202.

Although FIG. 4 illustrates a one-time overwrite operation performed using a write unit including user data 200 and ECC 205, further overwrite operations can be performed on cell array 110 using additional input data and new ECCs generated by combining the additional input data with error corrected read data. Thus nonvolatile memory device 100 can continuously update ECCs according to overwrite data used in further overwrite operations. Also, the generated ECC can be written in a corresponding location of spare region 112 in every overwrite operation.

Figure 5:
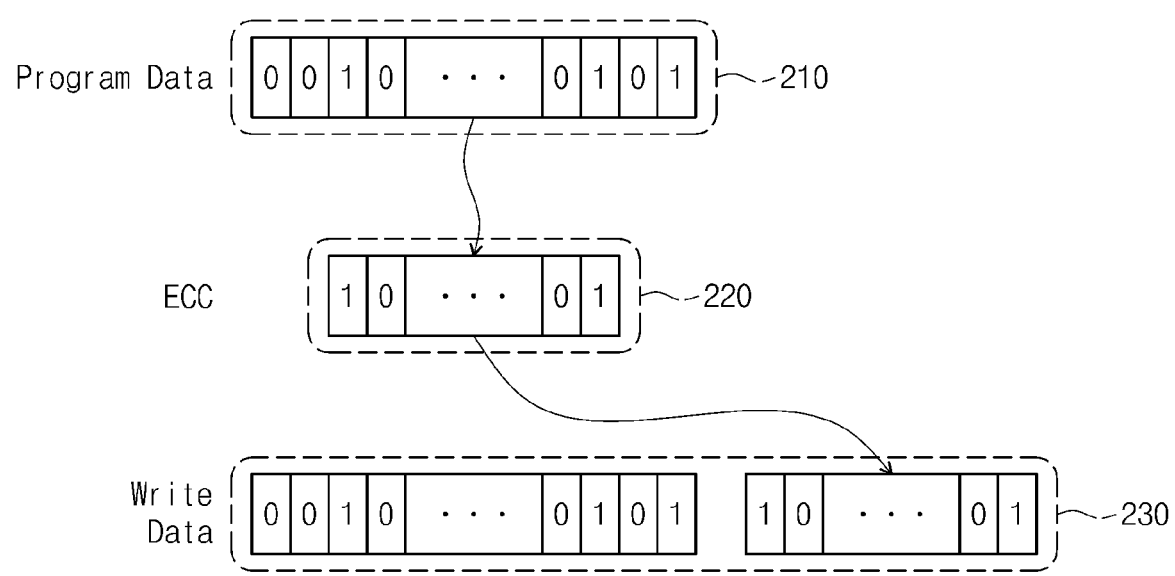
FIG. 5 is a diagram illustrating a method of performing a program operation in a nonvolatile memory device according to an embodiment of the inventive concept.

FIG. 5 is a diagram illustrating a method of performing a program operation in nonvolatile memory device 100 according to an embodiment of the inventive concept. In the program operation of FIG. 5, nonvolatile memory device 100 combines program data 210 with an ECC 220 to create a write unit 230.

Upon receiving an address and a program command CMD from an external device, control logic 130 decodes the program command to enable program controller 132. ECC circuit 143 generates ECC 220 from program data 210 under the control of program controller 132.

Program data 210 and ECC 220 constitute a write unit 230 for nonvolatile memory device 100. Write unit including program data 210 and ECC 220 is provided to write buffer 144 and then written in a target region of cell array 110 by write driver 145.

Figure 6:
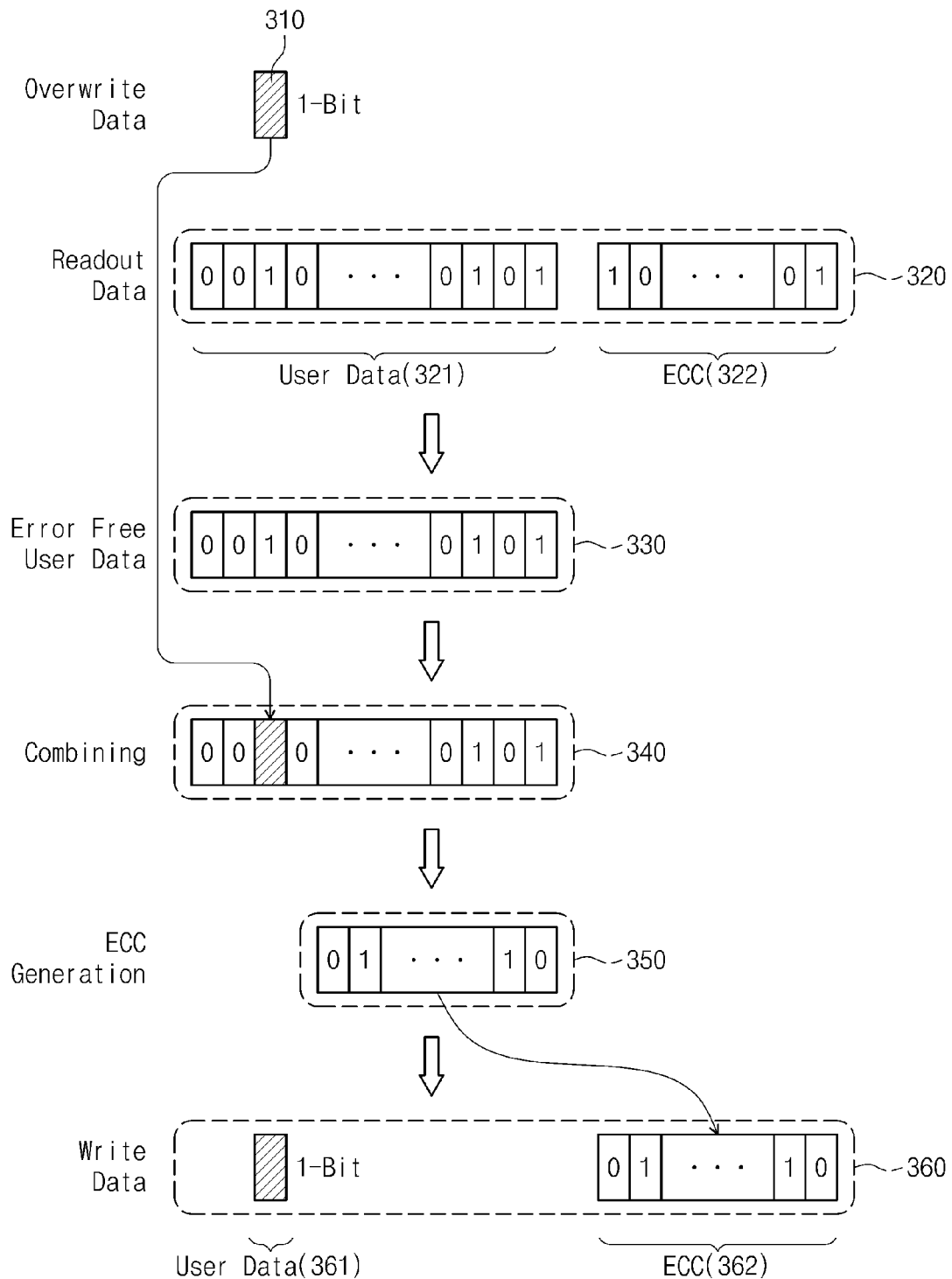
FIG. 6 is a diagram illustrating a method of performing an overwrite operation in a nonvolatile memory device according to an embodiment of the inventive concept.

FIG. 6 is a diagram illustrating a method of performing an overwrite operation in nonvolatile memory device 100 according to an embodiment of the inventive concept.

Referring to FIG. 6, an external device provides an address, a command CMD, and overwrite data 310 to nonvolatile memory device 100. Assuming that nonvolatile memory 100 writes data in units of a predetermined size, overwrite data 310 can be provided in a unit smaller than the predetermined size. For instance, in the example of FIG. 6, nonvolatile memory device 100 writes data in pages of 256 bits, and overwrite data 310 is provided as a single bit.

Overwrite controller 133 is enabled in response to an overwrite command, and read/write circuit 140 extracts read data 320 from a target region of cell array 110 corresponding to the address. Read data 320 comprises user data 321 and an ECC 322. ECC circuit 143 detects and corrects errors in user data 321 using ECC 322. More specifically, ECC circuit 143 uses ECC 322 to calculate a syndrome of the user data. The syndrome comprises information indicating whether there is an error in the user data and further comprises error location information indicating the location of any errors. Based on the syndrome, ECC circuit 143 determines whether there is an error in the user data and whether the error is correctable.

Where the syndrome indicates that there is no error in user data 321, ECC circuit 143 does not change the user data. Where the syndrome indicates that there is an error and the error is correctable, ECC circuit 143 identifies the error location and corrects the error with reference to the syndrome value. Where the syndrome value indicates an uncorrectable error, ECC circuit 143 is set to reread data from the corresponding cell region.

Error-free user data 330 is generated through an error detection and correction operation performed on read data 320. Thereafter, overwrite data 310 is combined with user data 330. In particular, overwrite data 310 is inserted among the bits of user data 330 to create updated new user data 340.

ECC circuit 143 generates an ECC 350 from new user data 340. ECC 350 is generated with a different value from ECC 322 included in read data 320.

After ECC 350 is generated, an overwrite operation is performed to store overwrite data 310 and ECC 350 in the target region of cell array 110. In the overwrite operation, overwrite data 310 is provided as user data 361 of a write unit 360, and ECC 350 is provided as an ECC 362 of write unit 360. Write unit 360 is then stored in the target region.

As indicated by the foregoing, in the method of FIG. 6, nonvolatile memory device 100 receives a command and overwrite data from an external device, generates a new ECC based on a combination of the overwrite data and stored data, and stores the new ECC together with the overwrite data. The method can improve the reliability of the stored overwrite data by updating error information as described above.

Figure 7:
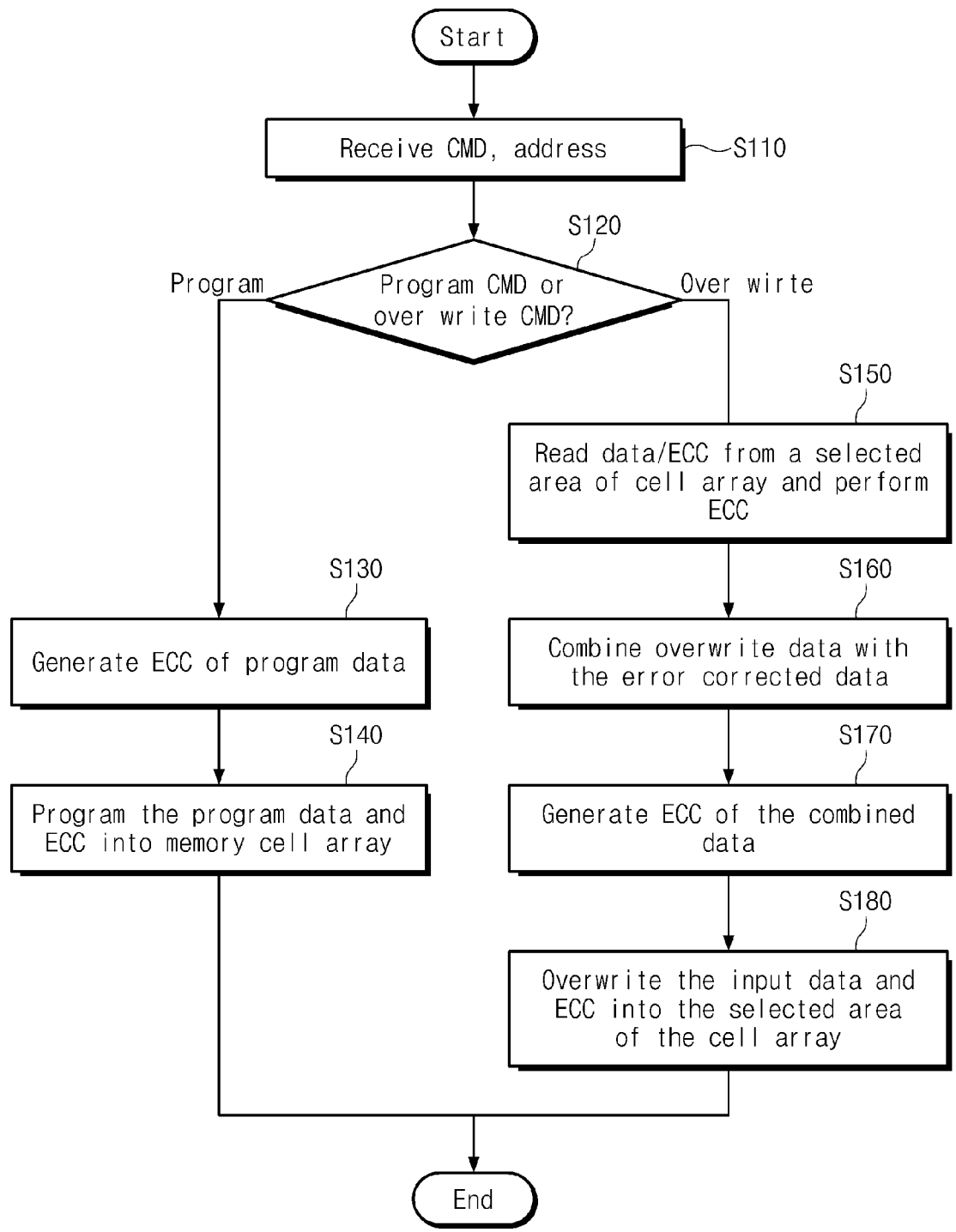
FIG. 7 is a flowchart illustrating a method of performing a write operation in a nonvolatile memory device according to an embodiment of the inventive concept.

FIG. 7 is a flowchart illustrating a method of performing a write operation (program or overwrite operation) of nonvolatile memory device 100 according to an embodiment of the inventive concept.

In the method of FIG. 7, the write operation is initiated by a command CMD provided from an external device to nonvolatile memory device 100. In a step S110, control logic 130 of nonvolatile memory device 100 receives the input command CMD and a corresponding address. The received command CMD is transferred to control logic 130, and the address is transferred to address decoder 120. Although not illustrated in FIG. 7, data for the write operation is typically input to nonvolatile memory device 100 after command CMD and the address. The data is stored in I/O buffer 150 of nonvolatile memory device 100.

Next, in a step S120, control logic 130 decodes command CMD to determine whether the write operation is a program operation or an overwrite operation. Where the write operation is a program operation, control logic 130 enables program controller 132 and the method proceeds to step S130. Where the write operation is an overwrite operation, control logic 130 enables overwrite controller 133 and proceeds to step S150.

In step S130, read/write circuit 140 generates an ECC from the received program data. The ECC can comprise, for instance, one or more parity bits or a Hamming code.

In step S140, ECC circuit 143 transfers the program data and the ECC to write buffer 144 as a write unit. Write driver 145 then programs the write unit in a target region of cell array 110. Where the write unit is successfully programmed in the target region, the method ends.

In step S150, ECC circuit 143 reads user data and a corresponding ECC from a target region before programming the overwrite data in the selected region. ECC circuit 143 performs error detection or correction on the read user data. Specifically, ECC circuit 143 generates a syndrome based on the read user data and the ECC. Where the generated syndrome indicates no error, ECC circuit 143 produces error-corrected read data without making any changes to the read data. Where the generated syndrome indicates that there is a correctable error in the read user data, ECC circuit 143 generates error-corrected read data by calculating the location of the error and correcting the error. Where the generated syndrome indicates that there is an uncorrectable error in the user data, ECC circuit 143 performs a reread operation on the target region or applies a different ECC to the read data.

In step S160, ECC circuit 143 combines the overwrite data with the error-corrected read data. The overwrite data can be combined with the error-corrected read data, for instance, by inserting the overwrite data at an overwrite location of the error-corrected read data. The combined overwrite data and error-corrected read data is used to generate the new ECC.

In step S170, ECC circuit 143 generates the new ECC from the combined overwrite data and error-corrected read data. This can be accomplished even where the overwrite data comprises only one bit.

In step S180, ECC circuit 143 writes the new ECC and the overwrite data in the target region. The error-corrected read data and the corresponding ECC can be discarded after the new ECC is generated.

In the write method of FIG. 7, the command and the address are input to nonvolatile memory device 100 before corresponding write data. Consequently, nonvolatile memory device 100 is able to detect the write operation before receiving the write data. In addition, nonvolatile memory device 100 can read and correct user data from the target region between detection of the write operation and generation of the new ECC.

In other embodiments, the order operations in the method of FIG. 7 can be variously modified.

Figure 8:
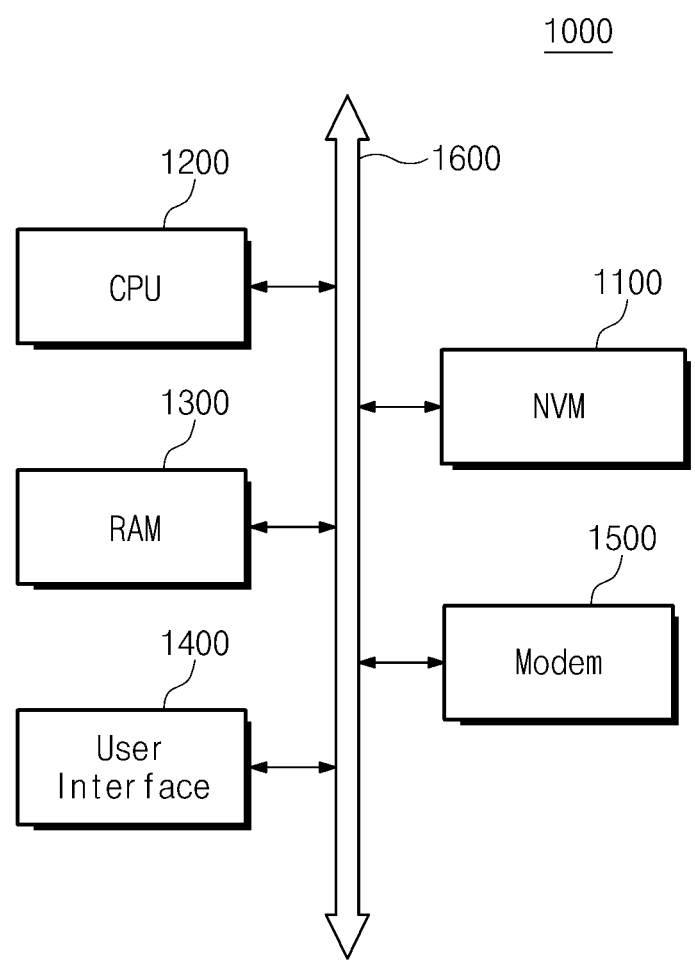
FIG. 8 is a block diagram of a computing system comprising an overwritable nonvolatile memory device according to an embodiment of the inventive concept.

FIG. 8 is a block diagram of a computing system 1000 comprising a nonvolatile memory (NVM) device 1100 according to an embodiment of the inventive concept.

Referring to FIG. 8, computing system 1000 comprises NVM device 1100, a CPU 1200, a RAM 1300, a user interface 1400, a modem (e.g., a baseband chipset) 1500 that are electrically connected to a system bus 1600. NVM 1100 comprises overwritable nonvolatile memory cells that can be overwritten using methods such as those described with reference to FIGS. 1 through 7.

In some embodiments, computing system 1000 is a mobile device. In such embodiments, power can be provided by a battery (not illustrated). Computing system 1000 can further comprise other features, such as an application chipset, a camera image processor (CIP), or a mobile DRAM.

Figure 9:
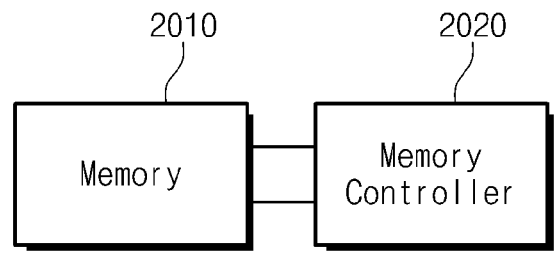
FIG. 9 is a block diagram illustrating a memory system comprising an overwritable nonvolatile memory device according to an embodiment of the inventive concept.

FIG. 9 is a block diagram illustrating a memory system comprising an overwritable nonvolatile memory device according to an embodiment of the inventive concept.

Referring to FIG. 9, the memory system comprises a memory device 2010 and a memory controller 2020 electrically connected to memory device 2010. Memory device 2010 is substantially identical to nonvolatile memory device 100 of FIG. 1. Memory controller 2020 generates signals for controlling memory device 2010. For example, memory controller 2020 typically generates commands and addresses for accessing memory device 2010.

Memory controller 2020 comprises a memory interface, a host interface, an ECC circuit, a CPU, and a buffer memory. The memory interface provides data from the buffer memory to memory device 2010, and transfers data from memory device 2010 to the buffer memory. Also, the memory interface provides commands or addresses from an external host to memory device 2010.

The host interface can communicate with the external host using any of various protocols, such as universal serial bus (USB), small computer system interface (SCSI), PCI express, ATA, parallel ATA (PATA), serial ATA (SATA), or serial attached SCSI (SAS). Memory controller 2020 further comprises an ECC circuit that generates ECCs from the data received from memory device 2010. The generated ECC is stored in a selected region of memory device 2010 together with data. The ECC circuit detects an error in the data read from memory device 2010. Where the detected error is correctable, the ECC circuit corrects the detected error.

The CPU analyzes and processes signals received from the external host. The CPU controls the external host or memory device 2010 through the host interface or the memory interface. The CPU typically controls write, read, and erase operations of memory device 2010 according to firmware for driving memory device 2010. The buffer memory temporarily stores write data received from the external host or data read from memory device 2010.

Figure 10:
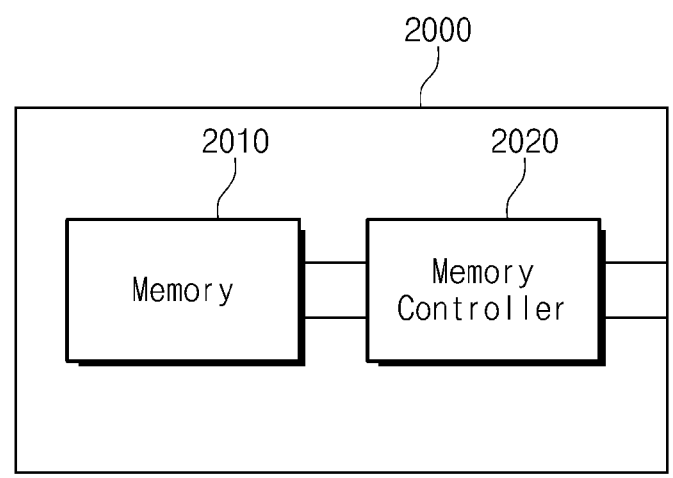
FIG. 10 is a block diagram illustrating a memory card comprising an overwritable nonvolatile memory device according to an embodiment of the inventive concept.

FIG. 10 is a block diagram illustrating a memory card 2000 comprising an overwritable nonvolatile memory device according to an embodiment of the inventive concept. Memory card 2000 is one example of the memory system illustrated in FIG. 9. Memory card 2000 can be mounted on an information processing device such as a digital camera, a PMP, a mobile phone, and a notebook computer. Examples of memory card 2000 include multimedia cards (MMCs), security digital (SD) cards, micro SD cards, memory sticks, ID cards, PCMCIA cards, chip cards, USB cards, smart cards, and compact flash (CF) cards.

Figure 11:
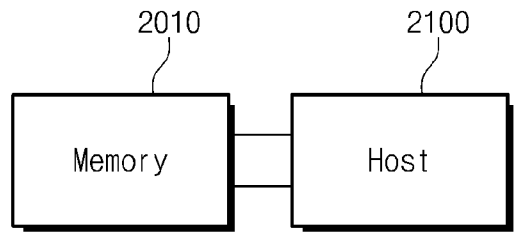
FIG. 11 is a block diagram illustrating an information processing system comprising an overwritable nonvolatile memory device connected to a host according to an embodiment of the inventive concept.

FIG. 11 is a block diagram illustrating an information processing system comprising an overwritable memory connected directly to a host according to an embodiment of the inventive concept. In the information system of FIG. 11, memory device 2010 is connected to a host 2100. Host 2100 comprises an information processing device such as a digital camera, a PMP, a mobile phone, and a notebook computer. Host 2100 generates control signals for controlling memory device 2010. For example, host 2100 can provide commands and addresses for accessing memory device 2010. Memory device 2010 typically comprises an overwritable nonvolatile memory device that is substantially identical to nonvolatile memory device 100.

Figure 12:
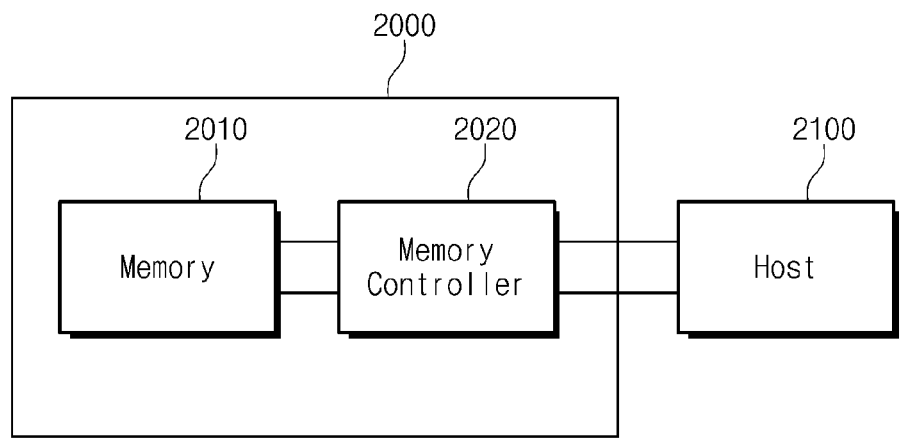
FIG. 12 is a block diagram of a computer system incorporating the memory card of FIG. 10.

FIG. 12 is a block diagram of a computer system comprising memory card 2000 of FIG. 10 connected to host 2100 of FIG. 11.

Referring to FIG. 12, host 2100 provides commands, addresses, and data to memory controller 2020. Memory controller 2020 then provides control signals to memory device 2010 according to the received commands, addresses, and data.

Figure 13:
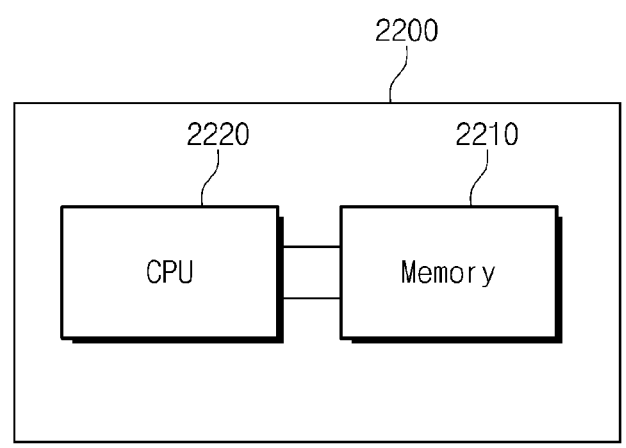
FIG. 13 is a block diagram of a computer system comprising an overwritable nonvolatile memory device connected to a central processing unit (CPU) according to an embodiment of the inventive concept.

FIG. 13 is a block diagram of a computer system 2200 comprising memory device 2210 connected to a CPU 2220 according to an embodiment of the inventive concept.

In the embodiment of FIG. 13, memory device 2210 is electrically connected to CPU 2220 through a connection unit such as a data bus. Computer system 2200 typically comprises an information processing device such as a digital camera, a PMP, a mobile phone, a desktop computer, or a notebook computer.

Figure 14:
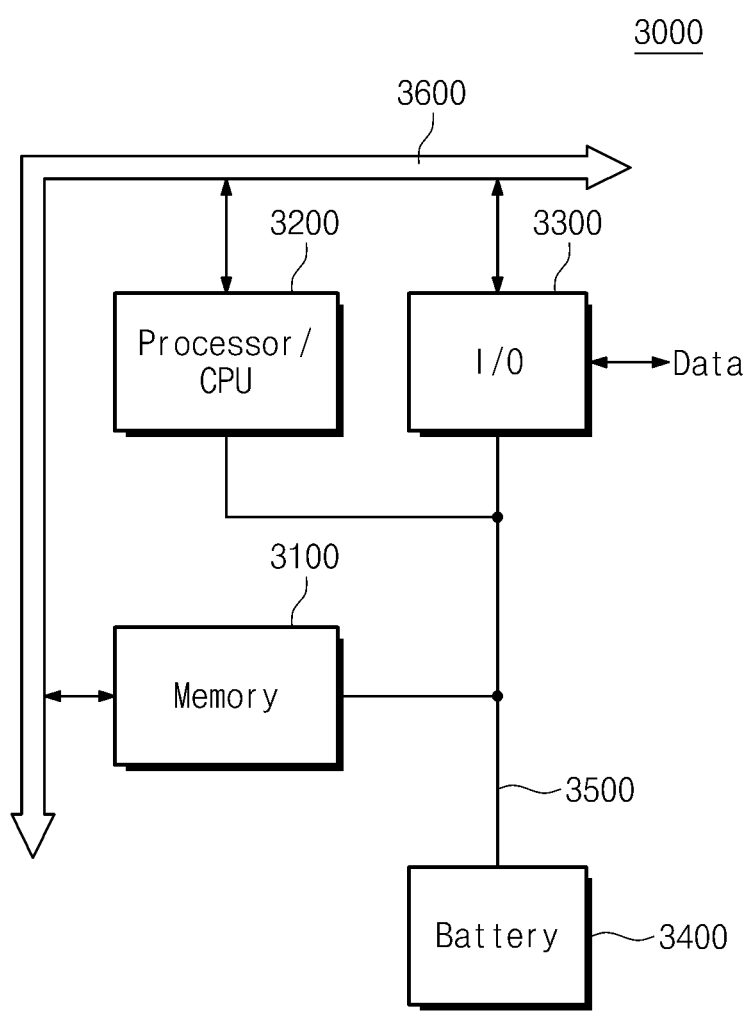
FIG. 14 is a block diagram of a portable system incorporating an overwritable nonvolatile memory device according to an embodiment of the inventive concept.

FIG. 14 is a block diagram of a portable system 3000 incorporating an overwritable nonvolatile memory device according to an embodiment of the inventive concept.

Referring to FIG. 14, portable system 3000 comprises a memory device 3100 connected to a microprocessor 3200 via a bus line 3600, a battery 3400 that supplies power to microprocessor 3200 via a power line 3500, and an input/output (I/O) device 3300 connected to bus line 3600.

I/O device 3300 receives data from an external device and transfers the data to microprocessor 3200 through bus line 3600. Microprocessor 3200 processes the received data and provides the received and processed data to memory device 3100 through bus line 3600. Memory device 3100 stores the data in selected memory cells. Data stored in memory device 3100 is read by microprocessor 3200 and output to the external device through I/O device 3300.

Memory device 3100 comprises a nonvolatile memory device such as that illustrated in FIG. 1. Accordingly, memory device 3100 can retain stored data even where power is disconnected from portable system 3000.

Figure 15:
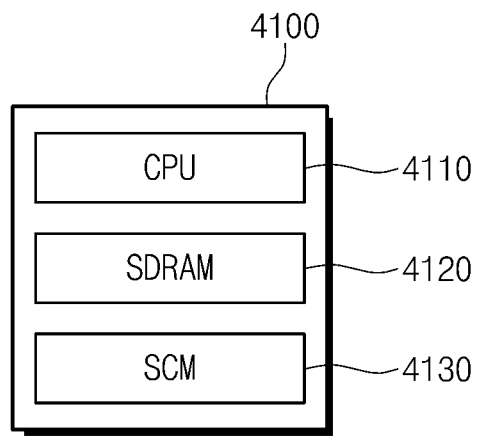
FIG. 15 is a block diagram illustrating a memory system comprising an overwritable nonvolatile memory device according to an embodiment of the inventive concept.

FIG. 15 is a block diagram illustrating a memory system 4100 comprising an overwritable nonvolatile memory, such as a storage class memory (SCM), according to an embodiment of the inventive concept.

Referring to FIG. 15, memory system 4100 comprises a CPU 4110, a synchronous dynamic random access memory (SDRAM) 4120, and an SCM 4130.

In some embodiments, SCM 4130 has a higher data access speed compared with a flash memory. For example, in an environment where CPU 4110 operates at 4 GHz, a phase-change RAM (PRAM), which is a type of SCM 4130, can have about 32 times higher data access speed than a flash memory. Accordingly, SCM 4130 can provide memory system 4100 with better performance compared with a flash memory.

Figure 16:
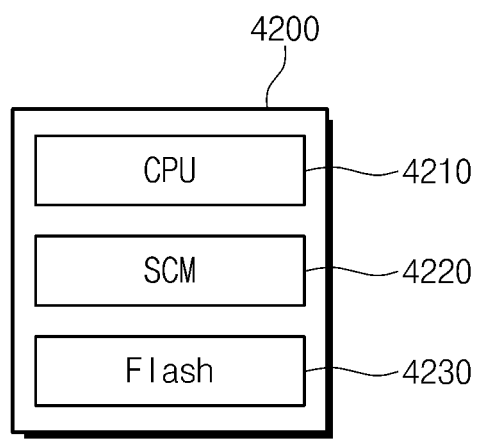
FIG. 16 is a block diagram illustrating a memory system comprising an overwritable nonvolatile memory device according to an embodiment of the inventive concept.

FIG. 16 is a block diagram illustrating an example of a memory system comprising an overwritable nonvolatile memory according to an embodiment of the inventive concept.

Referring to FIG. 16, memory system 4200 comprises a CPU 4210, an SCM 4220, and a flash memory 4230. In this embodiment, SCM 4220 is used as a main memory instead of an SDRAM.

SCM 4220 typically has lower power consumption than an SDRAM. The power consumption of a main memory can constitute up to about 40% of the total power consumption of a memory system. However, in comparison with a DRAM, SCM 4220 can reduce dynamic power consumption by about 53% on average and can reduce power consumption resulting from power leakage by about 73% on average. Consequently, memory system 4200 comprising SCM 4220 can reduce power consumption in comparison with a memory system mounted with an SDRAM.

Figure 17:
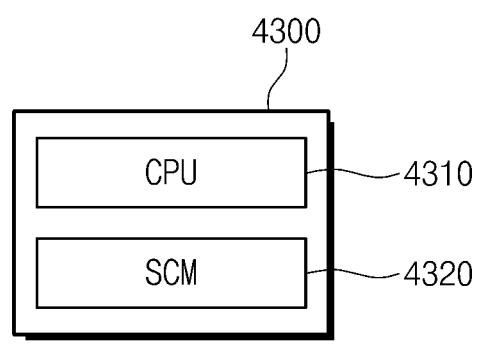
FIG. 17 is a block diagram illustrating a memory system comprising an overwritable nonvolatile memory device according to an embodiment of the inventive concept.

FIG. 17 is a block diagram illustrating an example of a memory system 4300 comprising an overwritable nonvolatile memory (SCM) such as that of FIGS. 1 through 7 instead of an SDRAM or a flash memory.

Referring to FIG. 17, memory system 4300 comprises a CPU 4310 and an SCM 4320. Herein, SDM 4320 can be used as a main memory instead of an SDRAM, or for mass data storage instead of a flash memory. Memory system 4300 having such a structure can be advantageous in terms of data access speed, power consumption, space utilization, and cost.

The above described devices and systems can be mounted in various types of packages. Examples of the such packages or package types include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

As indicated by the foregoing, in an overwrite operation of a nonvolatile memory device, write data is generated by combining received input data with read data obtained from a selected region of a memory cell array. An ECC is then generated from the write data, and the write data and ECC are written to the nonvolatile memory device over currently stored data. By generating the ECC in this manner, the overwrite operation is able to store the received input data in a relatively reliable manner.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of writing data in a nonvolatile memory device, comprising:
   receiving a command;
   receiving an address corresponding to a selected cell region of the nonvolatile memory device;
   receiving input data;
   decoding the command to determine whether it is a program command or an overwrite command;
   upon determining that the command is an overwrite command, identifying the input data as overwrite data, reading data from the selected cell region to produce read data, combining the read data with the overwrite data to produce combined data, generating an error correction code for the combined data, performing an overwrite operation to store the overwrite data in the selected cell region, and storing the error correction code for the combined data in the nonvolatile memory device.

2. The method of claim 1, further comprising detecting and correcting an error in the read data.

3. The method of claim 2, wherein the read data comprises user data and an error correction code for the user data.

4. The method of claim 3, wherein the combined data is generated by combining the user data with the overwrite data.

5. The method of claim 1, further comprising:
   upon determining that the command is a program command, identifying the input data as program data, generating an error correction code for the program data, and storing the program data and the error correction code for the program data, in the selected cell region.

6. The method of claim 1, wherein the read data is produced before the input data is received.

7. The method of claim 1, wherein the nonvolatile memory device comprises a phase change memory device.

8. The method of claim 1, wherein the error correction code comprises one or more parity bits or a Hamming code.

9. A nonvolatile memory device comprising:
   a cell array comprising overwritable memory cells;
   a read/write circuit that performs read and write operations on the cell array; and
   control logic that decodes a write command to determine whether the write command is an overwrite command or a program command, and upon determining that the write command is an overwrite command, controls the read/write circuit to read data from a selected region of the cell array to produce read data, combines the read data with overwrite data to generate combined data, generates an error correction code for the combined data, and controls the read/write circuit to store the overwrite data and the error correction code for the combined data in the cell array.

10. The nonvolatile memory device of claim 9, wherein the error correction code is a Hamming code.

11. The nonvolatile memory device of claim 9, wherein the control logic performs an error detection and correction operation on the read data.

12. The nonvolatile memory device of claim 9, wherein the control logic determines whether the read data contains an uncorrectable error, and upon determining that the read data contains an uncorrectable error, controls the read/write circuit to reread the data from the selected region.

13. The nonvolatile memory device of claim 9, wherein the cell array comprises phase change memory cells.

14. The nonvolatile memory device of claim 9, wherein the control logic comprises:
   a command decoder that decodes the write command;
   a program controller that is enabled where the write command is a program command; and
   an overwrite controller that is enabled where the write command is an overwrite command.

15. The nonvolatile memory device of claim 9, wherein the control logic comprises an error correction code (ECC) circuit that generates the error correction code for the combined data; and wherein the read/write circuit comprises a sense amplifier that senses the selected region to produce the read data, a read buffer that temporarily stores the read data, a write buffer that temporarily stores the overwrite data and the error correction code for the combined data, and a write driver that writes the overwrite data stored in the write buffer and the error correction code for the combined data in the selected region.

16. The nonvolatile memory device of claim 15, wherein the ECC circuit detects and corrects an error in the read data.

17. The nonvolatile memory device of claim 16, wherein the combined data is generated after the ECC has detected and corrected the error in the read data.

18. The nonvolatile memory device of claim 16, wherein the error correction code for the combined data comprises one or more parity bits.

19. The nonvolatile memory device of claim 9, wherein, where the write command is a program command, the control logic generates an error correction code for program data to be stored in the cell array.

20. The nonvolatile memory device of claim 9, further comprising:

an address decoder that decodes an address to select the selected region of the cell array; and an input/output buffer that receives the overwrite data from an external device under the control of the control logic.

\* \* \* \* \*